United States Patent [19]

Monge Navarro et al.

[11] Patent Number: 5,524,288
[45] Date of Patent: Jun. 4, 1996

[54] TUNING OF A RADIO RECEIVER

[75] Inventors: Alejandro J. Monge Navarro, Salo; Matti T. Koskinen, Perniö ; Rauno T. Aalto; Tapio I. Gustafsson, both of Salo; Henrik J. Sunell, Marttila; Jouko K. Heinonen, Salo, all of Finland

[73] Assignee: Nokia Mobile Phones Ltd., Salo, Finland

[21] Appl. No.: 157,618

[22] Filed: Nov. 24, 1993

[30] Foreign Application Priority Data

Dec. 10, 1992 [FI] Finland .................................. 925621

[51] Int. Cl.⁶ ..................................................... H04B 1/18
[52] U.S. Cl. ..................................... 455/180.4; 455/178.1; 455/182.2; 455/184.1; 455/192.3; 455/193.2; 455/340
[58] Field of Search ............................... 455/180.4, 182.1, 455/182.2, 182.3, 184.1, 192.3, 193.2, 193.3, 197.2, 197.3, 200.1, 318, 178.1, 340, 183, 195.1

[56] References Cited

U.S. PATENT DOCUMENTS

| 2,865,986 | 12/1958 | Parker | 455/340 |
|---|---|---|---|
| 4,685,150 | 8/1987 | Maier | 455/183 |
| 4,794,650 | 12/1988 | Yokoyama | 455/197 |
| 5,101,509 | 3/1992 | Lai | 455/183 |

FOREIGN PATENT DOCUMENTS

| 0147518 | 7/1985 | European Pat. Off. . |
|---|---|---|
| 0119561 | 12/1985 | European Pat. Off. . |
| 0354313 | 2/1990 | European Pat. Off. . |
| 2187906 | 9/1987 | United Kingdom . |
| WO84/02236 | 6/1984 | WIPO . |
| WO84/03184 | 8/1984 | WIPO . |
| WO87/02202 | 4/1987 | WIPO . |

OTHER PUBLICATIONS

Finnish Office Action dated Aug. 23, 1993 on corresponding Finnish Application 925621, English translation of Finnish Office Action.
Patent Abstracts of Japan vol. 12, No. 461 (E–689) Alpine Electron Inc. Jul. 30, 1988.
Patent Abstracts of Japan vol. 14, No. 348 (E–957) NEC Corp. May 9, 1990.
European Search Report on Application No. EP 93 30 9413.8.

*Primary Examiner*—Chi H. Pham
*Assistant Examiner*—Lee Nguyen
*Attorney, Agent, or Firm*—Perman & Green

[57] ABSTRACT

The present invention relates to a method of tuning a radio receiver to a desired frequency. The frequency of each tuning circuit in the radio receiver is controlled by controlling the capacitance diodes of the tuning circuits. The control is accomplished with an individual DA converter arranged for each tuning circuit with which the frequency of the tuning circuit associated therewith can be controlled independently of the other tuning circuits. The optimal control values of each DA converter is defined at least in two points of the frequency range of the radio receiver. These control values are stored in a memory provided in the radio receiver. On the basis of the stored control values the control values for the entire frequency range are calculated for each control means.

20 Claims, 3 Drawing Sheets

TUNING OF A RADIO RECEIVER

The present invention relates to a method of tuning a radio receiver to a desired frequency.

BACKGROUND OF THE INVENTION

In particular the invention relates to the automatic control of the tuning circuits of the radio receiver of a pager, operable in RDS/MBS networks, in the course of the production tuning and use of the pager. The pager operates in the standard FM radio frequency range (88 to 108 MHz). A received signal has been modulated into a third harmonic (57 kHz of the 19 kHz subcarrier wave in a standard stereo transmission. The pager scans the frequency range to find a station in the stereo transmission whereof said 57 kHz subcarrier wave is found. The radio receiver of the pager is a super-receiver, and it is narrow-banded compared, e.g., with mobile phones, because of which continuous tuning of the tuning circuits is indispensable to comply to the frequency. Continuous tuning is required of the antenna, the narrow-banded filters, e.g., the filter after the RF amplifier (two circuits), and a first local oscillator, all of which in the present context are usually called tuning circuits.

A principle block diagram of a prior art pager, i.e. of a radio receiver of the super type is shown in FIG. 1. The pager comprises an antenna 1 which receives signals and in which the resonance frequency has to be tuned to the receiving frequency. From the antenna the signal passes to a radio frequency RF amplifier 2 in which the received signal is amplified. From the amplifier 2 the signal travels via radio frequency filters 3a, 3b, wherein the desired frequencies are filtered from the received signal. These filters 3a, 3b are narrow-band filters, that is why it is important that they are tuned to the receiving frequency. The signal output by the radio frequency filters 3a, 3b is mixed in a mixer 5 to produce an intermediate frequency with the aid of a frequency obtained from a local oscillator 4. In order to time the signal to a desired intermediate frequency, it is important that the frequency provided by the local oscillator 4 can be controlled to conform to the frequency of the signal to be received. From the mixer 5, the signal is fed to an intermediate frequency section 6 where, e.g., filters are provided for filtering a desired signal at the intermediate frequency from the frequencies provided by the mixer 5, and then to circuits for processing the intermediate frequency signal.

The FM detected low-frequency signal obtained from the intermediate-frequency signal is fed to a data decoder in which the data received by the pager is processed into a form in which a message can be transmitted, e.g., to the display of the pager. Accordingly, a data decoder may comprise, in addition to the data processing circuits, for instance display control circuits and/or amplifiers to amplify the signal. In addition, the pager comprises a control means 8, preferably a D/A converter, for controlling the frequencies of the tuning circuits 1, 3a, 3b, and 4.

The basic tuning process for the tuning circuits is usually carried out during the production process by controlling manually the inductance or capacitance of the tuning circuit. The transmission of the frequency of the pager, while in operation, is accomplished by controlling the voltages of the capacitance diodes of the tuning circuits with the aid of a common DA converter. The capacitance of the capacitance diode changes as a function of tho voltage and, by changing the capacitance of each tuning circuit, they can be tuned on another frequency (the frequency band of the filter can be shifted, the resonance frequency of the antenna can be changed, and the frequency of the local oscillator can be affected). A second alternative is to use a control capacitor instead of the DA converter and the capacitance diodes, though this is not very practical; instead, the common control of the tuning circuits with one DA converter is an easier, more sophisticated and space saving control procedure.

Thus, for tuning the tuning circuits only one DA converter is conventionally used, with the output voltage of which all tuning circuits are controlled where the capacitance of the capacitance diodes is changed by changing the direct voltage provided by the DA converter. Thus, the tuning of the super-receiver, while in operation, is accomplished by controlling all tuning circuits of the receiver at the same time while only one quantity is being changed (voltage, capacitance, or inductance). This causes a so-called synchronization problem, i.e., the tuning circuits of the receiver are not precisely in alignment with the frequency to be received in the various points of the frequency range to be received because in the course of the production of the receiver the basic tuning must be accomplished manually and part of the tuning circuits are thereafter fixed or they will be tuned only in conjunction with the other tuning circuits. The basic tuning is usually accomplished by means of iteration in the lower and upper ends of the frequency range, whereby the precise tuning is achieved only with regard to part of the frequency range (upper or lower end) whereas external to said part of the range, the tuning may be offset as regards certain tuning circuits, and will thus cause deterioration in the operation as regards the reception sensitivity. Associated with the basic tuning, sufficient attention must be paid to the so-called synchronization between different tuning circuits. This will also lead to a lengthened tuning incident because the correct tuning must be provided by iteration. The procedure is conventional and generally used in the production of all narrow-banded super-receivers.

SUMMARY OF THE INVENTION

According to a first aspect of the present invention there is provided a method of tuning a radio recover, comprising a plurality of timing circuits, to a predetermined frequency, in which method the frequency of each tuning circuit is controlled by controlling an electrical characteristic of the tuning circuit with the aid of a control means, characterized in that for each tuning circuit an individual control means is provided with which the frequency of the tuning circuit associated therewith can be controlled independently of the other tuning circuits, whereby the optimal control values of each control means are defined at least in two points of the frequency range of the radio receiver, these control values being stored in a memory provided in the radio receiver, and on the basis of which the control values are calculated for each control means for the entire frequency range.

According to a second aspect of the present invention there is provided: a radio receiver, comprising a plurality of tuning circuits for tuning the receiver to the frequency to be received; control means, characterized in that the receiver comprises a control means for each tuning circuit for controlling the frequency of the tuning circuit associated therewith independently of the other tuning circuits; a memory for storing control values associated with the control means; and a microcontroller for controlling the control means, and for calculating the control values thereof for each receiving frequency on the basis of the control values in the memory.

An advantage of the present invention is the disclosure of a method with which the requirement for tracking is eliminated by tuning the tuning circuit of each receiver individually, independent of the tuning values of the other tuning circuits. With this method a uniform reception sensitivity is achieved within the entire frequency range.

Thus, a further advantage of the method of the invention is to accomplish, in addition to the tuning when in use, also the basic tuning (with the aid of DA converters). The radio receiver is provided, instead of the prior single converter, with a number of independent converters, i.e., each tuning circuit is provided with a converter of its own. Since each circuit to be tuned is provided with a control means of its own, preferably a DA converter, the requirement concerning tracking within the entire frequency range is eliminated. The circuits of the radio receiver to be tuned have been so designed that on the minimum and maximum capacitances of the capacitance diodes the entire frequency range required will be covered.

BRIEF DESCRIPTION OF THE DRAWINGS

An embodiment of tho present invention will now be described, by way of example, with reference to the accompanying drawings in which.

DETAILED DESCRIPTION OF THE INVENTION

Figure 1:
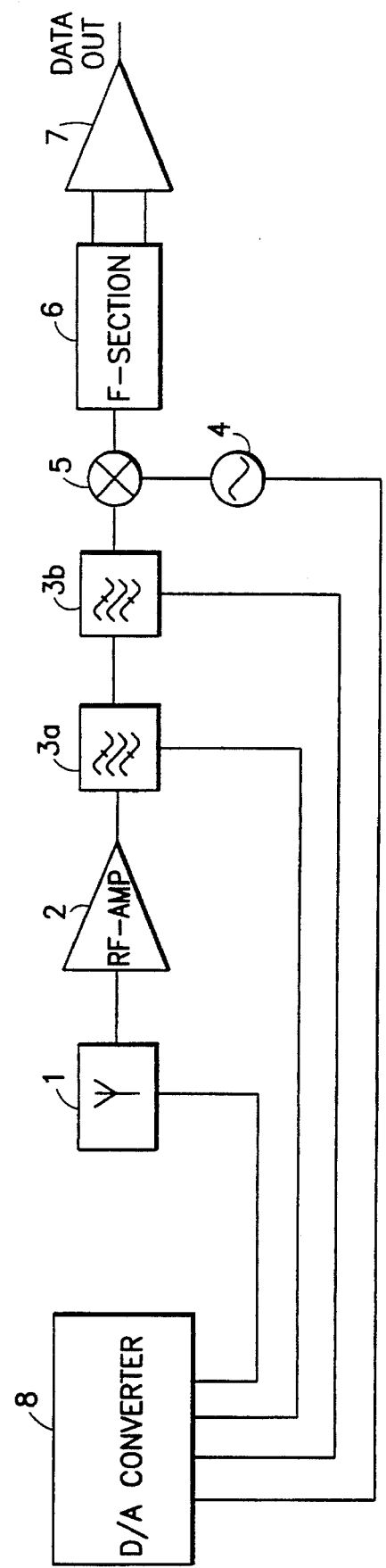
FIG. 1 presents a principle block diagram of a prior art radio receiver design.
Figure 2:
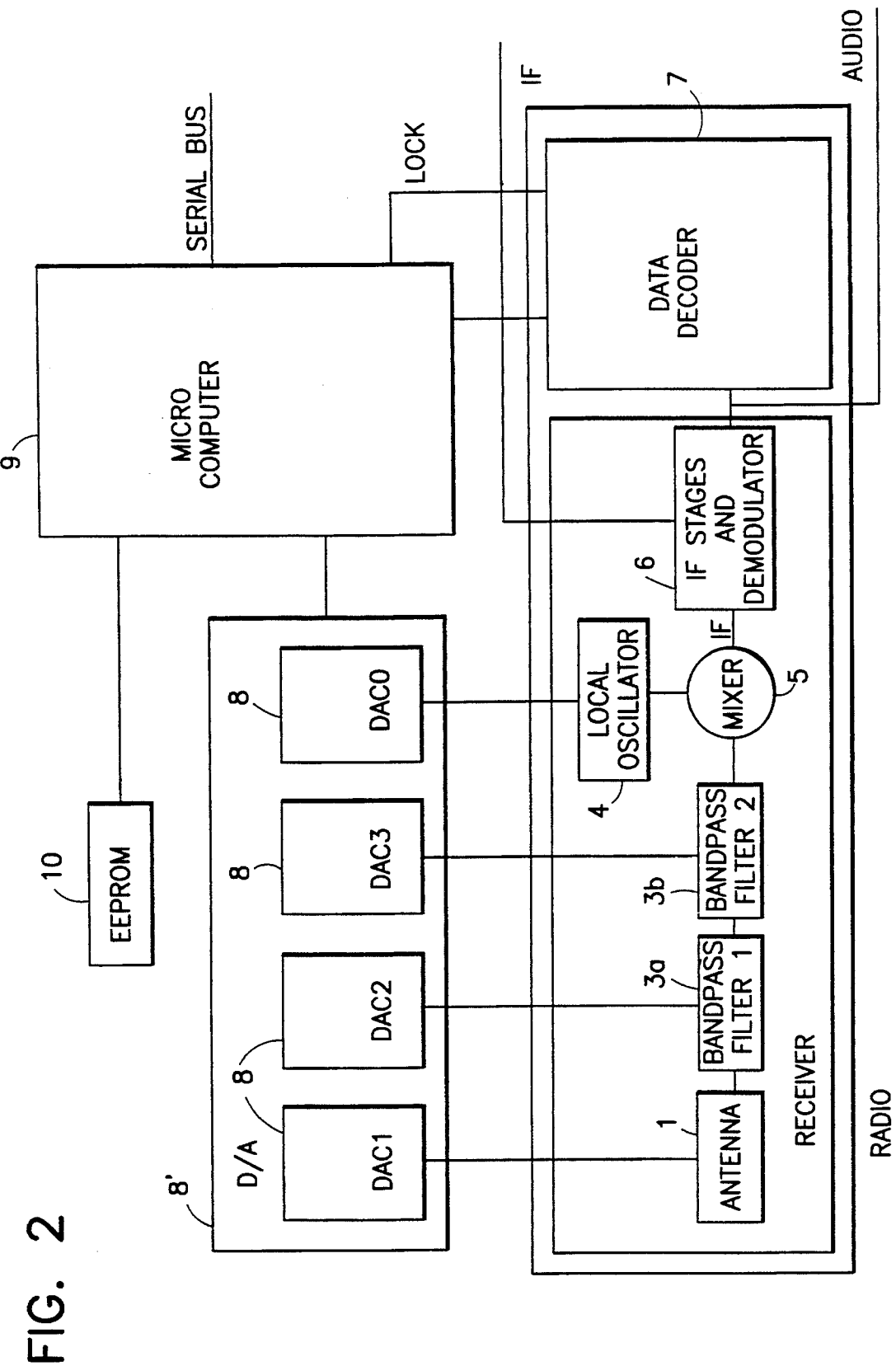
FIG. 2 presents a simplified block diagram of a radio receiver in accordance with the invention.
Figure 3:
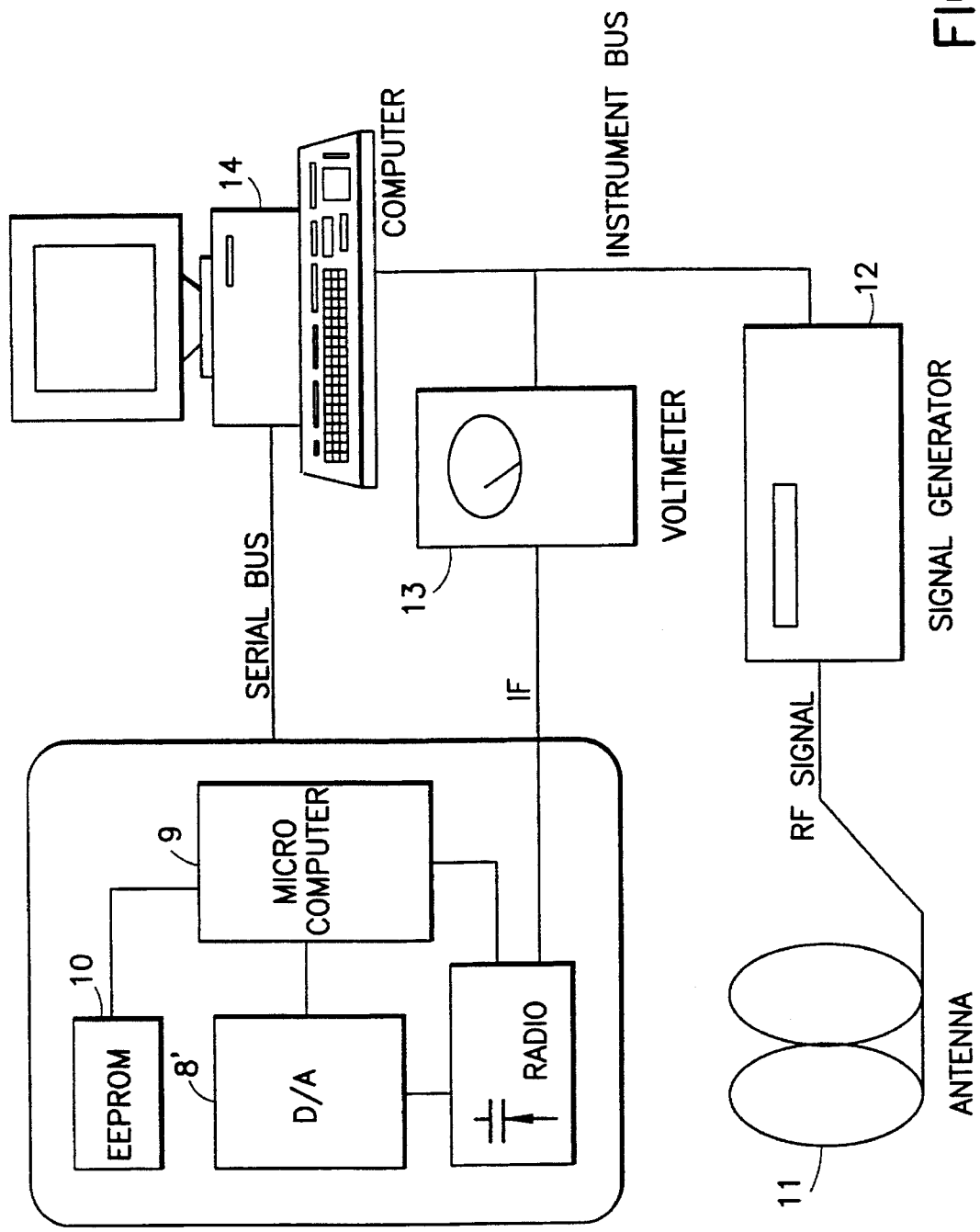
FIG. 3 shows an arrangement in the basic tuning in a radio receiver in accordance with the present invention.

A simplified block diagram of a radio receiver in accordance with the invention is presented in FIG. 2. An essential difference therein compared with the prior art receiver FIG. 1 is that the control circuit 8' comprises an individual DA converter 8 for each tuning circuit. In addition, it includes a microcontroller 9 for controlling the operation of the radio receiver and the DA converters 8, said controller comprising internal ROM and RAM memories, and an EEPROM memory 10 to be written and erased electrically, for storing the control values of the DA converters 8. The arrangement shown in FIG. 2 may, in fact, be somewhat varied so that, e.g., both the EEPROM memory 10 and the control circuit 8' may be included in the microcontroller 9 and the ROM and RAM memories are possibly separate circuits. The method in accordance with the invention and the operation of the radio receiver are described below more in detail with reference to FIGS. 2 and 3. In the tuning incident, a pager is placed in a so-called tuning jig, and a carrier wave on the tuning frequency is fed to the tuning antenna in the jig (FIG. 3). A tuning signal is produced by a signal generator 12, comprising for instance, a pager RF signal generator for generating a test signal (a tuning signal). A tuning signal on the radio frequency, produced by the signal generator 12, is applied to the antenna 11, whereby the tuning antenna 1 connected to the pager receives the signal.

In the basic tuning process the received signal, in IF form, is conducted from the intermediate frequency part 6 of the radio receiver (FIG. 2) to a voltmeter 13 measuring the voltage level of the intermediate-frequency signal IF and transmitting information thereof to the computer 14 controlling the measurement and the basic tuning. On the basis of the power level of the intermediate-frequency signal IF the computer 14 keeps controlling, with the aid of the processor 9 of the pager, the capacitance diodes of the tuning circuits in the radio until the maximum power level of the intermediate-frequency signal IF is reached. The measurement is carried out at least in two different points of the receiving frequency range. The more points there are in which the measurement is carried out, the more accurate result is obtained. In a reception frequency range the values may therefore be measured, for instance, in sixteen frequency points. During the production process of the radio receiver, the correct values of the D/A converters 8 are stored in the EEPROM circuit 10 of the apparatus, in the measured points of the frequency range to be received.

The microcontroller circuit 9 reads the tuning values from the EEPROM circuit 10 and on the basis thereof, forms with the aid of a mathematical model (based on the program it includes) the tuning values of the DA converters 8 corresponding to each point of the frequency range to be received.

The basic tuning process may also be accomplished on a basis other than the power level of the intermediate-frequency signal IF. Thus, the basic tuning is accomplished in conjunction with the production, and the aspect has no significance with regard to the present invention in what way the tuning values of the DA converters 8 are defined. Instead, the essential feature is that the optimal control values are set for them at least in two frequency points on the basis whereof the control values can be calculated for each DA converter 8 for the entire frequency range.

In an operational situation when a pager is seeking a station transmitting a data signal, the micro-controller 9 calculates every time the tuning data corresponds to the prevailing frequency and feeds the data to the DA converters 8, whereby the digital tuning information provided by the microcontroller 9 is, with the aid of the DA converters 8, of the control circuit 8' converted into an analog voltage signal controlling the capacitance diodes of the tuning circuits (or the capacitances thereof). In this manner, an accurate and stable tuning result is obtained within the entire receiving frequency range.

As said previously the tuning values for the DA-converters for every frequency point, i.e. for the whole reception frequency range can be calculated on the basis of at least two measured frequency points with a mathematical model. A mathematical model can be expressed, e.g., as a set of equations which express the relationship between frequency and DA-converter settings. Different approaches can be used to construct such a model: the model can be linear or logarithmic. A general model expressing the parameters which need to be considered in the model is expressed in the following form $$j(DACi)=G(f,Fh,Fl,ai,bi,ci)$$

in which j(DACi) is the counts in the DA-converter tuning stage i,

G is a general function to be constructed, f is the frequency for which a stage i (tuning circuit) is to be tuned, Fl is low end frequency (e.g. 87.5 MHz), Fh is high end frequency (e.g. 108 MHz), ai is bandwidth compression factor for stage i, bi is bandwidth offset factor for stage i, and ci is a third constant.

In order to relate the DA-converter tuning values to an absolute frequency the positions of both minimum and maximum frequencies of operation need to be determined. The frequency range for the ideal tuning range can be determined by frequencies Fl and Fh, whereby the bandwidth is BW=Fh−Fl, and the real tuning range can be defined to be between frequencies Fl' and Fh'. From this the above shown parameters ai and bi can be defined so that $$ai = \frac{Fh - Fl}{Fh' - Fl'} \text{ and}$$

$$bi = \frac{Fl}{Fl'}.$$

The limits for the values for ai and bi are theoretically 0<ai<1 and 0<bi<1 and practically these limits are 0.3<ai<1 and 0.5<bi<1.

One example for a linear model is expressed by the following equation:

$$f = bi \times Fl + \frac{BW \times j}{ai \times Ri} \times$$

$$\left\{ \frac{(ci-1)}{\ln(ci)} \times \left[ 1 + \frac{1}{2 + \frac{j \times (ci-1) \div Ri}{2 + \ldots}} \right] \right\}$$

in which Ri is the resolution, which can be Ri=2ri, where ri is the number of bits of the DA converter, and for ci a value of 1 can be used.

An example of a logarithmic model can be expressed by the following equation:

$$f = bi \times Fl + (BW \div ai) \times \ln\left[ 1 + \frac{j(DACi)}{-Kl} \right]$$

in which Kl can be derived from the equation j(DACi)−Kl×(1−$e^{fr}$), where fr stands for a relative frequency determined by $$fr = \frac{f - (bi \times Fl)}{(Fh - Fl) \div ai}.$$

One skilled in the art may develop different models which could be used in the present invention for the calculation of the tuning values for a specific frequency. For example, a simpler model without the parameter ci could be used for the linear model and a more sophisticated model with the parameter ci could be used for the logarithmic model.

The invention is not restricted to the examples presented in the foregoing, and it can be modified within the scope of the accompanying claims. Thus, instead of DA converters, other control circuits can be used, such as trimmers, for tuning each tuning circuit individually in separation, preferably by means of direct voltage, with which the capacitance, or capacitances, of a capacitance diode of the tuning circuit is changed, or instead of capacitance diodes an individual control capacitor can be used for each tuning circuit. The invention can be used for tuning tuning circuits, not only in pagers but also in any apparatus provided with a radio receiver, such as a radio phone.

In view of the foregoing it will be clear to a person skilled in the art that modifications may be incorporated without departing from the scope of the present invention.

What we claim is:

1. A method for the continuous tuning of tuning circuits in a radio receiver comprising a plurality of tuning circuits, each having a defined frequency range, selectable electrical characteristics, and being tunable to a predetermined frequency, which method comprises the steps of:

providing individual control means, each of said control means comprising a digital to analogue converter and having control values including optimal control values, for independently controlling the frequency of respective tuning circuits, each comprising a capacitance, by determining the selection of said selectable electrical characteristics;

controlling the frequency of each tuning circuit by selecting an electrical characteristic of the tuning circuit with the aid of its respective control means and capacitance independently of the other tuning circuits;

defining the optimal control values for each control means in terms of at least two points of the defined frequency range of its tuning circuit;

storing said optimal control values in a memory provided in the radio receiver, said stored values being the basis of which the control values are calculated for each control means for the entire defined frequency range; and using said stored values with the aid of a mathematical model to calculate the control values of the control means for determining the electrical characteristic to be selected by each control means to tune its respective tuning circuit to its predetermined frequency, and wherein said mathematical model is linear and expressed in the parameters as follows:

$$j(DACi) = G(f, Fh, Fl, ai, bi)$$

where j(DACi) is the counts in the digital to analog converter stage i,

G is a general function to be constructed, f is the frequency for which a tuning circuit stage i is to be tuned, Fl is a low end frequency, Fh is a high end frequency;

ai is a bandwidth compression factor for tuning circuit stage i, and bi is a bandwidth offset factor for tuning circuit stage i.

2. A method as claimed in claim 1, wherein the capacitance of each tuning circuit comprises a capacitance diode and the tuning of each tuning circuit is controlled by controlling the voltage of said capacitance diode included in the tuning circuit.

3. A method as claimed in claim 2, wherein the voltage of the capacitance diode of each tuning circuit is controlled with the aid of the digital to analogue converter of said control means provided for each tuning circuit.

4. A method as claimed in claim 2, wherein said radio receiver comprises means for producing an intermediate-frequency signal having a power level and the optimal control values of each control means are obtained by measuring, at least in two points of the frequency range of each tuning circuit of the radio receiver, the power level of the intermediate-frequency signal thereof, while controlling with the control means the capacitance diodes of the tuning circuits so that as high a power level of the intermediate-frequency signal as possible is obtained and, the control values of each control means obtained for said frequency points are stored as said optimal control values in the memory.

5. A method as claimed in claim 1, wherein each of said control means comprises a trimmer.

6. A radio receiver, comprising a plurality of tuning circuits for continuous tuning of the receiver to a frequency to be received, said receiver comprising:

a control means for each tuning circuit for controlling the receiving frequency of the tuning circuit associated therewith independently of the other tuning circuits, said control means having control values including optimal control values for determining the receiving frequency of the associated tuning circuit and comprising a capacitance in said associated tuning circuit, said capacitance in each tuning circuit comprising a capacitance diode for changing the receiving frequency of the tuning circuit and said control means for each tuning circuit further comprising a digital to analogue converter connected to the capacitance diode for feeding a control voltage thereto;

a memory for storing control values associated with the control means; and a micro-controller for controlling the control means, and for calculating the control values thereof with the aid of a mathematical model for determining each receiving frequency on the basis of the control values stored in the memory, and wherein said mathematical model is linear and expressed in the parameters as follows:

$$j(DACi)=G(f,Fh,Fl,ai,bi)$$

where j(DACi) is the counts in the digital to analog converter stage

G is a general function to be constructed, f is the frequency for which a tuning circuit stage i is to be tuned, Fl is a low end frequency, Fh is a high end frequency, ai is a bandwidth compression factor for tuning circuit stage i, and bi is a bandwidth offset factor for tuning circuit stage i.

7. A radio receiver as claimed in claim 6, wherein said tuning circuits comprise an antenna, radio frequency filters, and a local oscillator.

8. A radio receiver as claimed in claim 6, further comprising means for interfacing to external apparatus for accomplishing the basic tuning thereof.

9. A radio receiver as claimed in claim 6, further comprising:

means for producing an intermediate-frequency signal having a power level; and wherein said micro-controller comprises:

means for obtaining the optimal control values of each control means by measuring, at least in two points of the frequency range of each tuning circuit of the radio receiver, the power level of the intermediate-frequency signal thereof, while controlling with the control means the capacitance diodes of the tuning circuits so that as high a power level of the intermediate-frequency signal as possible is obtained; and means for inputting the control values of each control means obtained for said frequency points as said optimal control values in said memory.

10. A radio receiver as claimed in claim 6, wherein said control means for each tuning circuit further comprises a trimmer connected to the capacitance diode for feeding a control voltage thereto.

11. A method for the continuous tuning of tuning circuits in a radio receiver comprising a plurality of tuning circuits, each having a defined frequency range, selectable electrical characteristics, and being tunable to a predetermined frequency, which method comprises the steps of:

providing individual control means, each of said control means comprising a digital to analogue converter and having control values including optimal control values, for independently controlling the frequency of respective tuning circuits, each comprising a capacitance, by determining the selection of said selectable electrical characteristics;

controlling the frequency of each tuning circuit by selecting an electrical characteristic of the tuning circuit with the aid of its respective control means and capacitance independently of the other tuning circuits;

defining the optimal control values for each control means in terms of at least two points of the defined frequency range of its tuning circuit;

storing said optimal control values in a memory provided in the radio receiver, said stored values being the basis of which the control values are calculated for each control means for the entire defined frequency range; and using said stored values with the aid of a mathematical model to calculate the control values of the control means for determining the electrical characteristic to be selected by each control means to tune its respective tuning circuit to its predetermined frequency, and wherein said mathematical model is linear and expressed in the parameters as follows:

$$j(DACi)=G(f,Fh,Fl,ai,bi,ci)$$

where j(DACi) is the counts in the digital to analog converter stage i,

G is a general function to be constructed, f is the frequency for which a tuning circuit stage i is to be tuned, Fl is a low end frequency, Fh is a high end frequency, ai is a bandwidth compression factor for tuning circuit stage i, bi is a bandwidth offset factor for tuning circuit stage i, and ci is a third constant.

12. A method as claimed in claim 11, wherein each of said control means comprises a trimmer.

13. A method as claimed in claim 11, wherein the capacitance of each tuning circuit comprises a capacitance diode and the tuning of each tuning circuit is controlled by controlling the voltage of said capacitance diode included in the tuning circuit.

14. A method as claimed in claim 13, wherein the voltage of the capacitance diode of each tuning circuit is controlled with the aid of the digital to analogue converter of said control means provided for each tuning circuit.

15. A method as claimed in claim 13, wherein said radio receiver comprises means for producing an intermediate-frequency signal having a power level and the optimal control values of each control means are obtained by measuring, at least in two points of the frequency range of each tuning circuit of the radio receiver, the power level of the intermediate-frequency signal thereof, while controlling with the control means the capacitance diodes of the tuning circuits so that as high a power level of the intermediate-frequency signal as possible is obtained and, the control values of each control means obtained for said frequency points are stored as said optimal control values in the memory.

16. A radio receiver, comprising a plurality of tuning circuits for continuous tuning of the receiver to a frequency to be received, said receiver comprising:

a control means for each tuning circuit for controlling the receiving frequency of the tuning circuit associated therewith independently of the other tuning circuits, said control means having control values including optimal control values for determining the receiving frequency of the associated tuning circuit and comprising a capacitance in said associated tuning circuit, said capacitance in each tuning circuit comprising a capacitance diode for changing the receiving frequency of the tuning circuit and said control means for each tuning circuit further comprising a digital to analogue converter connected to the capacitance diode for feeding a control voltage thereto;

a memory for storing control values associated with the control means; and a micro-controller for controlling the control means, and for calculating the control values thereof with the aid of a mathematical model for determining each receiving frequency on the basis of the control values stored in the memory, and wherein said mathematical model is linear and expressed in the parameters as follows:

$$j(DACi)=G(f,Fh,Fl,ai,bi,ci)$$

where j(DACi) is the counts in the digital to analog converter stage i,

G is a general function to be constructed, f is the frequency for which a tuning circuit stage i is to be tuned, Fl is a low end frequency, Fh is a high end frequency, ai is a bandwidth compression factor for tuning circuit stage i, bi is a bandwidth offset factor for tuning circuit stage i, and ci is a third constant.

17. A radio receiver as claimed in claim 16, comprising an antenna, radio frequency filters, and a local oscillator.

18. A radio receiver as claimed in claim 16, comprising interfaces to external apparatus for accomplishing the basic tuning thereof.

19. A radio receiver as claimed in claim 16, further comprising:

means for producing an intermediate-frequency signal having a power level; and wherein said micro-controller comprises:

means for obtaining the optimal control values of each control means by measuring, at least in two points of the frequency range of each tuning circuit of the radio receiver, the power level of the intermediate-frequency signal thereof, while controlling with the control means the capacitance diodes of the tuning circuits so that as high a power level of the intermediate-frequency signal as possible is obtained; and means for inputting the control values of each control means obtained for said frequency point as said optimal control values in said memory.

20. A radio receiver as claimed in claim 16, wherein said control means for each tuning circuit further comprises a trimmer connected to the capacitance diode for feeding a control voltage thereto.

* * * * *

UNITED STATES PATENT AND TRADEMARK OFFICE
CERTIFICATE OF CORRECTION

PATENT NO. : 5,524,288
DATED : June 4, 1996
INVENTOR(S) : Monge Navarro et al.

It is certified that error appears in the above-indentified patent and that said Letters Patent is hereby corrected as shown below:

In column 7, line 23, after the word "stage" add --i,--.
(Claim 6)

Signed and Sealed this

Third Day of September, 1996

Attest:

BRUCE LEHMAN

*Attesting Officer*     *Commissioner of Patents and Trademarks*